(12) United States Patent
Furey et al.

(10) Patent No.: US 6,180,433 B1
(45) Date of Patent: Jan. 30, 2001

(54) COMBINATION INDUCTIVE COIL AND INTEGRATED CIRCUIT SEMICONDUCTOR CHIP IN A SINGLE LEAD FRAME PACKAGE AND METHOD THEREFOR

(75) Inventors: Lee Furey, Phoenix; Joseph Fernandez, Gilbert, both of AZ (US)

(73) Assignee: Microchip Technology Incorporated, Chandler, AZ (US)

( * ) Notice: Under 35 U.S.C. 154(b), the term of this patent shall be extended for 0 days.

(21) Appl. No.: 09/231,726

(22) Filed: Jan. 15, 1999

Related U.S. Application Data

(62) Division of application No. 08/929,579, filed on Sep. 15, 1997, now Pat. No. 5,909,050.

(51) Int. Cl.$^7$ ............................ H01L 21/44; H01L 21/48; H01L 21/50
(52) U.S. Cl. ........................ 438/106; 438/121; 438/123; 438/124
(58) Field of Search ................................ 438/106, 121, 438/123, 124

(56) References Cited

U.S. PATENT DOCUMENTS 5,429,992 * 7/1995 Abbott et al. .
5,639,694 * 6/1997 Diffenderfer et al. .
5,683,994 * 11/1997 Joiner et al. .

* cited by examiner

*Primary Examiner*—Kevin M. Picardat
*Assistant Examiner*—D. M. Collins
(74) *Attorney, Agent, or Firm*—Paul N. Katz; Ronald L. Chichester; Frohwitter

(57) ABSTRACT

A combination inductive coil and integrated circuit semiconductor chip is provided in a single lead frame package. The lead frame is preferably made of a copper alloy and has a flat configuration. The chip is electrically connected to end portions of the inductive coil thus permitting the inductive coil to function as an antenna for the chip.

20 Claims, 2 Drawing Sheets

U.S. 6,180,433 B1

COMBINATION INDUCTIVE COIL AND INTEGRATED CIRCUIT SEMICONDUCTOR CHIP IN A SINGLE LEAD FRAME PACKAGE AND METHOD THEREFOR

DIVISIONAL APPLICATION

This application is a Divisional Application of U.S. patent application Ser. No. 08/929,579, filed Sep. 15, 1997, U.S. Pat. No. 5,904,050 in the name of the same inventors as the present patent application.

RELATED APPLICATIONS

This application is also related to the co-pending U.S. patent application entitled "A SINGLE-SIDED PACKAGE INCLUDING AN INTEGRATED CIRCUIT SEMICONDUCTOR CHIP AND INDUCTIVE COIL AND METHOD THEREFOR" filed Sep. 15, 1997, in the names of the same inventors as this application and assigned to the same assignee. Accordingly, the contents of the related application is incorporated by reference into this application.

FIELD OF THE INVENTION

This invention relates generally to the use of passive devices with semiconductor devices and methods therefor and, more particularly, to a combination inductive coil and integrated circuit semiconductor chip in a single lead frame package and method therefor.

BACKGROUND OF THE PRIOR ART

In the past, passive devices such as inductors, capacitors and resistors were combined with active devices such as diodes and transistors on a printed circuit board to manufacture electronic circuits and/or electronic systems.

As the technology developed, active devices of various types such as bipolar and MOS (or unipolar) devices became integrated into a single semiconductor chip. Integration of these active devices and also passive devices such as resistors and capacitors into a single semiconductor chip led to the formation of electrical circuits in a single semiconductor chip which became known as an integrated circuit semiconductor chip.

Packaging of such integrated circuit semiconductor chips became very important. As a result, integrated circuit semiconductor chip manufacturers have sought for ways to inexpensively and reliably package integrated circuit semiconductor chips.

One early packaging technique was to provide hybrid packages which usually incorporated integrated circuit semiconductor chips with passive devices such as capacitors and resistors on a ceramic substrate surface of a ceramic package which would have metal pins to permit the ceramic package to be inserted into via holes in a printed circuit board containing a number of such ceramic packages interconnected to provide either an electronic circuit or electronic system. Ceramic packages were very costly resulting in higher costs for a printed circuit board using multiple ceramic packages.

In an effort to significantly reduce manufacturing costs, lead frame packages were developed to protectively house integrated circuit semiconductor chips. A lead frame package generally comprised a metal lead frame member that would carry an integrated circuit semiconductor chip on a portion thereof. Wirebonding techniques were used to electrically connect terminal portions or pads of the integrated circuit semiconductor chip to fingers of the lead frame structure. Subsequently, the integrated circuit semiconductor chip on the lead frame structure with its wirebond connections thereto was encapsulated with plastic to provide a plastic encapsulated lead frame package. From a manufacturing cost point of view, plastic encapsulated lead frame packages were very inexpensive as compared to, for example, ceramic type packages.

A need existed to develop electronic type products that would be relatively inexpensive to make and that would take advantage of the lead frame manufacturing technology. Specifically, a need existed for improved lead frame type products that could perform functions that were not provided by the available lead frame products.

SUMMARY OF THE INVENTION

Accordingly, it is an object of this invention to provide an improved lead frame package and method.

It is a further object of this invention to provide an improved lead frame package and method which combines an integrated circuit semiconductor chip and a passive device in a single lead frame package.

It is another object of this invention to provide an improved lead frame package and method which combines an integrated circuit semiconductor chip and an inductor in a single lead frame package.

It is still another object of this invention to provide an improved lead frame package and method which combines an integrated circuit semiconductor chip and an inductive coil in a single lead frame package where the integrated circuit semiconductor chip is a transmitter.

It is another object of this invention to provide an improved lead frame package and method which combines an integrated circuit semiconductor chip in a single lead frame package where the integrated circuit semiconductor chip is a receiver and the inductive coil is the antenna for the receiver.

BRIEF DESCRIPTION OF THE PREFERRED EMBODIMENTS

In accordance with one embodiment of this invention, a combination inductive coil and integrated circuit semiconductor chip is provided in a single lead frame package which comprises, in combination: a single package; a lead frame located in the single package and having a coil configuration, the lead frame located in one horizontal plane; and an integrated circuit semiconductor chip located in the single package and coupled to the lead frame and having at least one terminal pad electrically connected to at least one portion of the coil configuration of the lead frame. Preferably the integrated circuit semiconductor chip has at least two terminal pads, one of the two terminal pads of the integrated circuit semiconductor chip being electrically connected to one end portion of the coil configuration of the lead frame, the other of the two terminal pads of the integrated circuit semiconductor chip being electrically connected to the other end portion of the coil configuration of the lead frame.

In accordance with another embodiment of this invention, a method of combining an inductive coil and integrated circuit semiconductor chip in a single lead frame package is provided which comprises the steps of: providing a single package; providing a lead frame located in the single package and having a coil configuration, the lead frame located in one horizontal plane; and providing an integrated circuit semiconductor chip located in the single package and coupled to the lead frame and having at least one terminal pad electrically connected to at least one portion of the coil configuration of the lead frame.

The foregoing and other objects, features and advantages of this invention will be apparent from the following more particular description of the preferred embodiments of the invention as illustrated in the accompanying drawings.

DESCRIPTION OF THE SPECIFICATION

Figure 1:
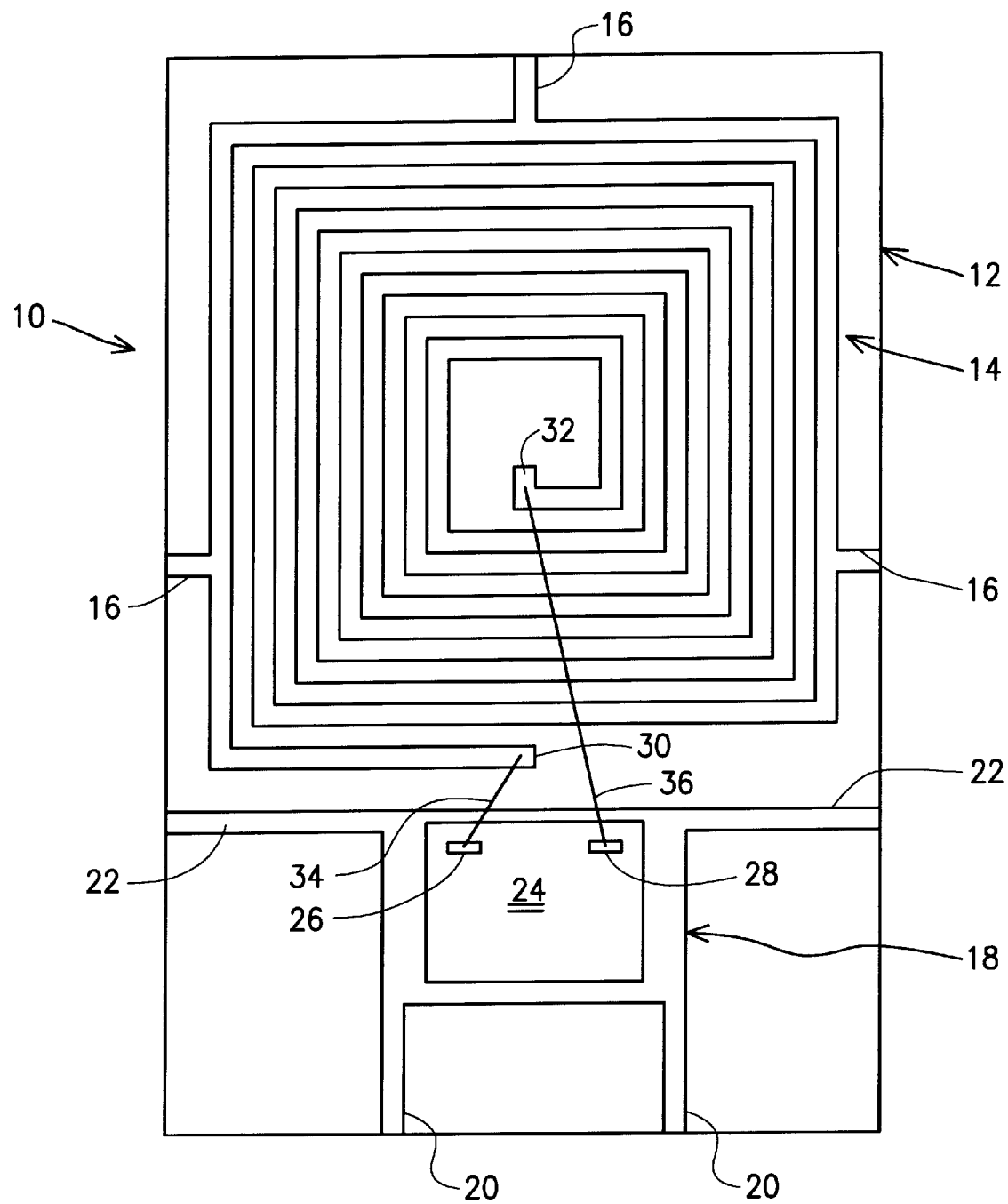
FIG. 1 is a sectional view taken through a single lead frame plastic encapsulated package of this invention showing an integrated circuit semiconductor chip mounted on a portion of the single lead frame plastic encapsulated package and electrically connected to the two end portions of an inductive coil that is spaced from the chip and which comprises a substantial portion of the lead frame of this package.

Referring to FIG. 1, reference number 10 generally refers to a combination inductive coil and integrated circuit semiconductor chip in a single lead frame package. The package 10 comprises a plastic encapsulated envelope 12 that is made of the type of plastic encapsulation type material used in plastic encapsulated packages. Contained within the plastic encapsulated envelope 12 as an inductive coil shape or configuration lead frame structure 14 having, for example, three attached tie members 16 which have been cut off from the tie members (not shown) of adjacent similarly configured coil shaped lead frames (not shown) that were, for example, stamped out in one metal stamping operation used to form a number of these coil shaped lead frames at one time for subsequent separation into individual coil shaped lead frame elements like the one shown in FIG. 1. The tie bars 16 functions to hold the coil 14 and the subsequently described die paddle in the same plane. In the embodiment of FIG. 1, the inductive coil 14 is preferably made of a copper alloy such as copper alloy known as CDA194. Preferably, the copper lines of the inductive coil 14 are about 10 mils wide and the space between adjacent copper lines is preferably about 10 mils wide. In the embodiment of FIG. 1, the inductive coil 14 preferably is flat and has six turns, however, if desired, a greater or lesser number of turns can be used depending upon the magnitude or amount of electrical inductance desired. The length of the inductive coil 14 is, for example, about 160 mils long. The operating signal of the RF inductive coil 14 is, for example, 13.6 Megahertz and the range is from about a couple of inches to about one meter.

A die attach paddle or pad 18 also is part of the lead frame, but not a portion of the inductive coil 14 because it is spaced therefrom as shown in FIG. 1 where it is shown connected to a pair of vertical tie bar type members 20 and a top horizontal tie bar member 22. The members 20 and 22 were previously connected to corresponding tie bar members (not shown) of adjacent lead frame structures (not shown) before being separated into the configuration shown in FIG. 1. An integrated circuit semiconductor chip 24 is shown mounted on and connected by, for example, a suitable adhesive on its backside portion to the die attach paddle 18.

In the embodiment of FIG. 1, two terminal pads 26 and 28 of the integrated circuit semiconductor chip 24 are, respectively, electrically connected to outer 30 and inner 32 end portions of the inductive coil 14 respectively, by means of electrically conductive wire bonds 34 and 36. The chip 24 can be any type of integrated circuit semiconductor chip, however, if the chip 24 is a transmitter type of integrated circuit semiconductor chip, then an electronic signal generated by such a chip 24 can be transmitted by means of the inductive coil 14 functioning as a transmitting antenna with an RF signal of 13.6 Megahertz at a range of from about a couple of inches to about a meter. Correspondingly, if the chip 24 is a receiver type of integrated circuit semiconductor chip, then, by means of the inductive coil 14 functioning as a receiving antenna, the chip 24 can receive appropriate electronic signals. If desired, the chip 24 can be both a transmitter and receiver to permit the chip 24 to selectively function as either a transmitter or receiver.

Figure 2:
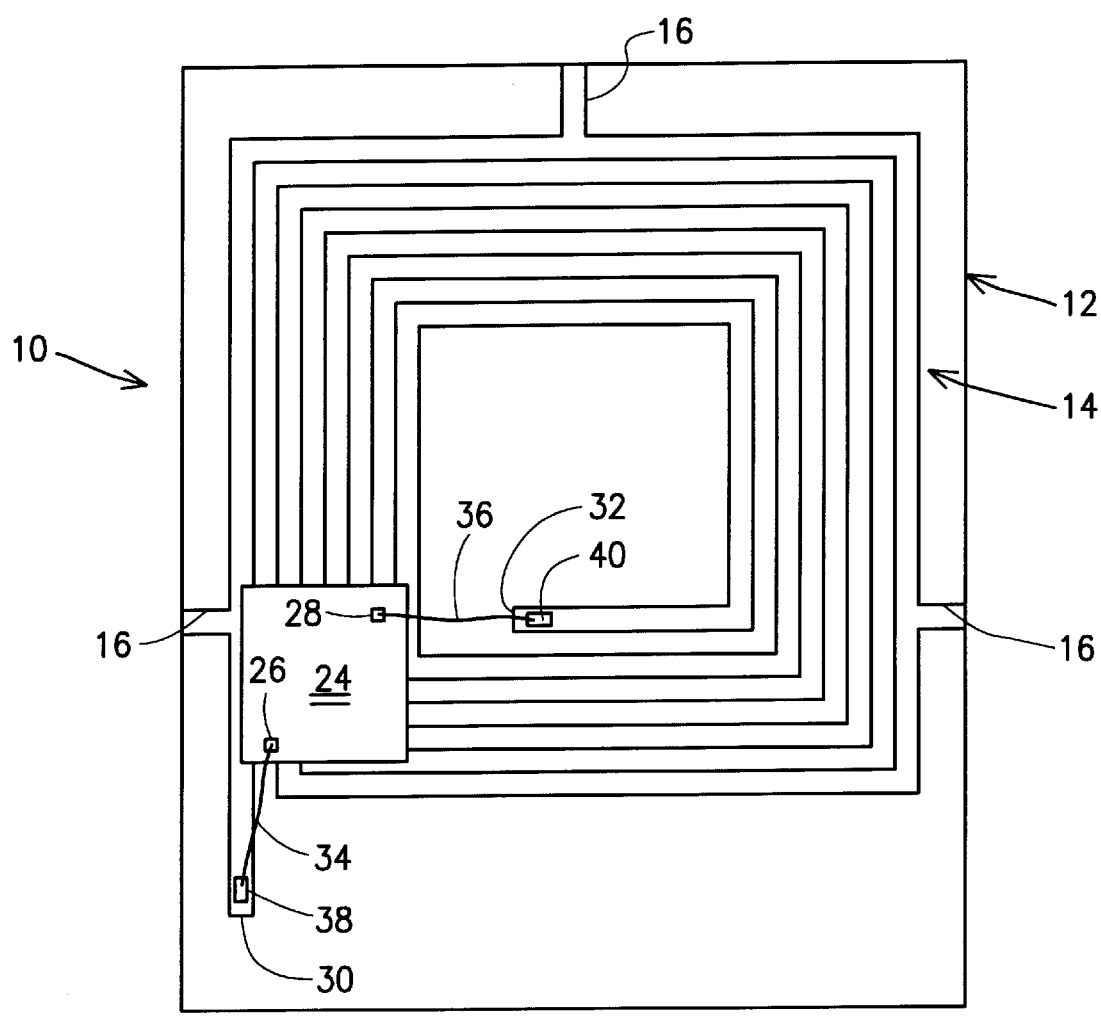
FIG. 2 is also a sectional view taken through another embodiment of a single lead frame plastic encapsulated package of this invention showing an integrated circuit semiconductor chip mounted on a corner end portion of an inductive coil that comprises a substantial portion of the lead frame of this package wherein the chip is dielectrically insulated from the portions of the inductive coil located beneath the chip, but electrically connected to the two end portions of the inductive coil.

Referring to FIG. 2, the same reference numerals used in FIG. 1 are used in FIG. 2 to designate the same elements. In the embodiment of FIG. 2, there are four turns for the inductive coil 14 rather than the six turns depicted in FIG. 1. Again, the number of turns for the inductive coil can be varied as desired for specific reasons such as the magnitude or amount of inductance needed for the inductive coil 14. Furthermore, in the embodiment of FIG. 2, the integrated circuit semiconductor chip 24 is preferably located over a corner portion of the coil 14 adjacent to where the end portion 30 of the coil 14 is located. A dielectric type adhesive or epoxy is used to adhere the chip 24 to the portions of the coil 14, in the corner, located beneath the chip 24. The use of the dielectric adhesive prevents a bottom portion of the chip 14 to produce an electrically short across adjacent portions of the coil 14. In the embodiment of FIG. 2, the wire bond 34 provides an electrical contact between terminal pad 26 of the chip 24 and a silver plated tip portion 38 located at the end portion 30 of the inductive coil 14. Similarly, a silver plated tip portion 40 at the end portion 32 of the coil 14 also permits the wire bond 36 to provide electrical contact between the terminal pad 28 of the integrated circuit chip 24 and the silver plated tip portion 40 of the end portion 32 of the coil 14. The silver plated tip portions 38 and 40 are created by silver plating the appropriate region on the copper surface of the copper inductive coil 14. The embodiment of FIG. 2 is more compact which should provide shorter electrically conductive paths and faster response times. Also, the embodiment of FIG. 2 requires less lead frame material and should be less costly than the embodiment structure of FIG. 1. One further significant advantage of the embodiments of FIGS. 1 and 2 is that the RF inductive coils 14 of these two embodiments can be made of the same material as is used in stamping out lead frames for other packages. Another significant advantage of the embodiment of FIG. 2 is that more coil turns per area can be used, if desired, and the substantial elimination or minimization of crossing wire bonds over coils of the inductive coil 14 is achieved in FIG. 2. The silver plated tip portions 38 and 40 shown in FIG. 2 can also be used for the embodiment of FIG. 1, if desired. One further significant advantage of the embodiments of FIGS. 1 and 2 is that, if desired, no external leads are provided outside of the package of FIGS. 1 and 2 and the antenna (inductive coil 14) can be solely used to provide electronic signals into the packages of FIGS. 1 or 2 and to also, if desired, take electronic signals out of the packages of FIGS. 1 and 2.

While the invention has been particularly shown and described with reference to the preferred embodiments thereof, it will be understood by those skilled in the art that the foregoing and other changes in form and details may be made therein without departing from the spirit and scope of the invention.

What is claimed is:

1. A method of combining an inductive coil and integrated circuit semiconductor chip in a single lead frame package comprising the steps of:

providing a single package;

providing a lead frame located in said single package and having a coil configuration, said lead frame located in one horizontal plane; and providing an integrated circuit semiconductor chip located in said single package and coupled to said lead frame and having at least one terminal pad electrically connected to at least one portion of said coil configuration of said lead frame.

2. The method of claim 1 wherein said integrated circuit semiconductor chip having at least two terminal pads, one of said two terminal pads of said integrated circuit semiconductor chip being electrically connected to one end portion of said coil configuration of said lead frame, the other of said two terminal pads of said integrated circuit semiconductor chip being electrically connected to the other end portion of said coil configuration of said lead frame.

3. The method of claim 2 wherein both of said two terminal pads of said integrated circuit semiconductor chip being located on a top surface of said integrated circuit semiconductor chip, a bottom surface portion of said integrated circuit semiconductor chip being connected to a portion of said lead frame.

4. The method of claim 3 wherein said single package is a plastic encapsulated single package.

5. The method of claim 1 wherein said coil configuration of said lead frame being a substantially flat coil configuration.

6. The method of claim 5 wherein said coil configuration of said lead frame is a coil made of a copper alloy.

7. The method of claim 6 wherein said copper alloy is a CDA/94 copper alloy.

8. The method of claim 6 wherein said copper coil having two end portions, each of said two end portions having silver filled tip portions.

9. The method of claim 8 wherein said silver filled tip portions being spot silver plated tip portions silver plated onto each of said two end portions of said copper coil.

10. The method of claim 2 wherein said coil configuration of said lead frame being a substantially flat coil configuration, said coil configuration of said lead frame is a coil made of a copper alloy, said copper coil having two end portions, each of said two end portions having silver filled tip portions, one of said two terminal pads of said integrated circuit semiconductor, being electrically connected to a silver filled tip portion located at one of said two end portions of said copper coil, the other of said two terminal pads of said integrated circuit semiconductor chip being electrically connected to a silver filled tip portion located at the other of said two end portions of said copper coil.

11. The method of claim 1 wherein said integrated circuit semiconductor chip is a transmitter, said coil configuration of said lead frame is a transmitting antenna for said transmitter.

12. The method of claim 1 wherein said integrated circuit semiconductor chip is a transmitter, said coil configuration of said lead frame is a transmitting antenna for said transmitter.

13. The method of claim 1 wherein said integrated circuit semiconductor chip being located over a substantially corner region of said coil configuration of said lead frame.

14. The method of claim 1 wherein said integrated circuit semiconductor chip being located adjacent one side portion of said coil configuration of said lead frame.

15. The method of claim 3 wherein said integrated circuit semiconductor chip having at least two terminal pads, one of said two terminal pads being electrically connected to one end portion of said coil configuration of said lead frame, the other one of said two terminal pads being electrically connected to the other end portion of said coil configuration of said lead frame.

16. The method of claim 15 wherein said one end portion of said coil configuration of said lead frame being located adjacent one side of said integrated circuit semiconductor chip, said other end portion of said coil configuration of said lead frame being located adjacent another side of said integrated circuit semiconductor chip.

17. The method of claim 14 wherein said integrated circuit semiconductor chip having at least two terminal pads, one of said two terminal pads being electrically connected to one end portion of said coil configuration of said lead frame, the other one of said two terminal pads being electrically connected to the other end portion of said coil configuration of said lead frame, said one end portion of said coil configuration of said lead frame being located in a center portion of said coil configuration of said lead frame spaced from said integrated circuit semiconductor chip, said other end portion of said coil configuration of said lead frame being located adjacent to one side portion of said integrated circuit semiconductor chip.

18. The method of claim 17 wherein said integrated circuit semiconductor chip being located on and attached to a portion of said lead frame having a substantially rectangular configuration and spaced from said other end portion of said coil configuration of said lead frame.

19. The method of claim 15 wherein said one end portion of said coil configuration of said lead frame being located in a center portion of said coil configuration of said lead frame, said other end portion of said coil configuration of said lead frame extending underneath and past said integrated circuit semiconductor chip.

20. The method of claim 19 wherein said integrated circuit semiconductor chip being insulated from and attached to said corner region of said coil configuration of said lead frame.

* * * * *